(12) United States Patent
Chiu et al.

(10) Patent No.: US 9,907,186 B1
(45) Date of Patent: Feb. 27, 2018

(54) ELECTRONIC PACKAGE STRUCTURE AND METHOD FOR FABRICATING THE SAME

(71) Applicant: Siliconware Precision Industries Co., Ltd., Taichung (TW)

(72) Inventors: Chih-Hsien Chiu, Taichung (TW);
Chen-Wen Huang, Taichung (TW);
Hsin-Lung Chung, Taichung (TW);
Wen-Jung Tsai, Taichung (TW);
Jia-Huei Hung, Taichung (TW);
Fu-Tang Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/607,872

(22) Filed: May 30, 2017

(30) Foreign Application Priority Data

Aug. 24, 2016 (TW) .............................. 105127016 A
Jan. 24, 2017 (TW) .............................. 106102616 A (51) Int. Cl.
*H01L 23/495* (2006.01)
*H05K 3/32* (2006.01)
*H01L 23/00* (2006.01)
*H01L 23/373* (2006.01)
*H01L 21/48* (2006.01)

(52) U.S. Cl.
CPC ......... *H05K 3/323* (2013.01); *H01L 21/4853* (2013.01); *H01L 23/373* (2013.01); *H01L 24/73* (2013.01)

(58) Field of Classification Search
CPC ....................... H01L 21/4825; H01L 23/49506

USPC .......................................... 257/787; 438/123
See application file for complete search history.

(56) References Cited

U.S. PATENT DOCUMENTS

| | | | | |
|---|---|---|---|---|
| 5,790,378 A | * | 8/1998 | Chillara | H01L 23/3121 174/537 |
| 6,137,164 A | * | 10/2000 | Yew | H01L 23/49816 257/686 |
| 6,424,034 B1 | * | 7/2002 | Ahn | H01L 25/18 257/685 |
| 2007/0181989 A1 | * | 8/2007 | Corisis | H01L 21/561 257/686 |
| 2009/0243069 A1 | * | 10/2009 | Camacho | H01L 23/49531 257/686 |
| 2012/0139122 A1 | * | 6/2012 | Honjo | H01L 25/16 257/773 |

(Continued)

*Primary Examiner* — George Fourson, III
(74) *Attorney, Agent, or Firm* — Mintz Levin Cohn Ferris Glovsky and Popeo, P.C.; Peter F. Corless; Steven M. Jensen (57) ABSTRACT

An electronic package structure is provided, which includes: a carrier; at least one electronic component and a plurality of conductive elements disposed on the carrier; a metal frame bonded to the conductive elements; and an encapsulant formed on the carrier and the metal frame and encapsulating the electronic component and the conductive elements. The metal frame is exposed from the encapsulant to serve as an electrical contact. As such, instead of using a mold having a particular size corresponding to the electronic package structure as in the prior art, the present disclosure can use a common mold to form the encapsulant, thereby reducing the fabrication cost. The present disclosure further provides a method for fabricating the electronic package structure.

23 Claims, 8 Drawing Sheets

(56) References Cited

U.S. PATENT DOCUMENTS

2014/0264914 A1* 9/2014 Meyer ................... H01L 23/31
                                                     257/774
2015/0357269 A1* 12/2015 Im ..................... H01L 23/49541
                                                     257/675
2016/0284631 A1* 9/2016 Cabahug ........... H01L 23/49531

* cited by examiner

ELECTRONIC PACKAGE STRUCTURE AND METHOD FOR FABRICATING THE SAME

CROSS-REFERENCE TO RELATED APPLICATION

This application claims under 35 U.S.C. § 119(a) the benefit of Taiwanese Patent Application No. 105127016, filed Aug. 24, 2016, and Taiwanese Patent Application No. 106102616, filed Jan. 24, 2017 the entire contents of which are incorporated herein by reference.

BACKGROUND

1. Technical Field

The present disclosure relates to semiconductor structures, and, more particularly, to an electronic package structure and a method for fabricating the same.

2. Description of Related Art

Along with the rapid development of portable electronic products, related products have been developed toward the trend of high density, high performance and miniaturization. Accordingly, various package on package (PoP) technologies have been developed to meet the requirements of high density and miniaturization.

Figure 1:
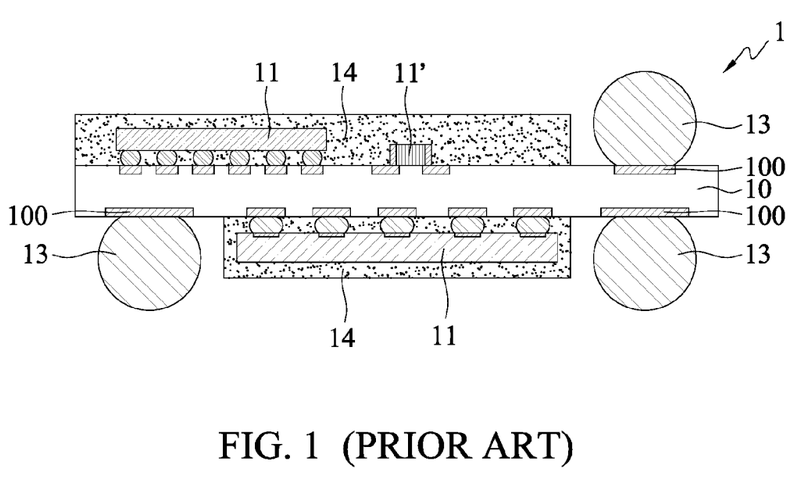
FIG. 1 is a schematic cross-sectional view of a conventional semiconductor package structure.

FIG. 1 is a schematic cross-sectional view of a conventional semiconductor package structure 1. Referring to FIG. 1, to fabricate the semiconductor package structure 1, semiconductor elements 11 and passive elements 11' are disposed on upper and lower sides of a substrate 10, respectively, and encapsulated by an encapsulant 14. I/O pads 100 of the substrate 10 are exposed from the encapsulant 14. Thereafter, a plurality of solder balls 13 are disposed on the I/O pads 100, thus allowing an electronic device such as a circuit board (not shown) to be mounted on the semiconductor package structure 1 through the solder balls 13.

However, in the conventional semiconductor package structure 1, since the molding range of the encapsulant 14 is reduced to expose the I/O pads 100, a mold used for the molding process is required to have a particular size corresponding to the semiconductor package structure 1. Consequently, such a mold is not applicable to various sizes of semiconductor package structures 1, thus incurring a high fabrication cost.

Further, since the semiconductor elements 11 and the passive elements 11' are encapsulated by the encapsulant 14, the semiconductor elements 11 and the passive elements 11' have a poor heat dissipating effect.

Therefore, there is a need to provide an electronic package structure and a fabrication method thereof so as to overcome the above-described drawbacks.

SUMMARY

In view of the above-described drawbacks, the present disclosure provides an electronic package structure, which comprises: a carrier; at least one electronic component disposed on the carrier; a plurality of conductive elements disposed on the carrier; a metal frame having a plurality of conductive pads bonded to the conductive elements; and an encapsulant formed on the carrier and/or the metal frame and encapsulating the electronic component and/or the conductive elements.

The present disclosure further provides a method for fabricating an electronic package structure, which comprises: providing an electronic unit having a carrier with at least one electronic component and a plurality of conductive elements disposed on the carrier; bonding the electronic unit with a metal frame through the conductive elements, wherein the metal frame has a plurality of conductive pads and the metal frame is bonded to the conductive elements through the conductive pads; and forming an encapsulant on the carrier and/or the metal frame to encapsulate the electronic component and/or the conductive elements.

In an embodiment, the carrier is a packaging substrate, a coreless circuit structure, or a lead frame.

In an embodiment, the carrier has a first side and a second side opposite to the first side, and the electronic component is disposed on the first side and the second side of the carrier.

In an embodiment, the carrier has a first side and a second side opposite to the first side, and the metal frame is disposed on the first side and the second side of the carrier.

In an embodiment, the electronic component is positioned between the carrier and the metal frame.

In an embodiment, the conductive elements are solder paste, conductive adhesive, solder balls, copper core balls, passive elements or metal members.

In an embodiment, at least one of the conductive elements is bonded to the carrier through an insulator.

In an embodiment, the metal frame is a lead frame.

In an embodiment, the conductive pads are exposed from the encapsulant.

In an embodiment, the metal frame further has a board corresponding in position to the electronic component. In another embodiment, the conductive pads are separated from the board. In an embodiment, the board is free from being in contact with the electronic component. In another embodiment, the board is in contact with the electronic component. The board and the conductive pads have the same or different heights. Further, the board can be bonded to the electronic component through an intermediate layer.

According to the present disclosure, the conductive elements of the electronic unit are bonded to the metal frame and the metal frame is exposed from the encapsulant to serve as an electrical contact. As such, instead of using a mold having a particular size corresponding to the electronic package structure as in the prior art, the present disclosure can use a common mold to form the encapsulant, thereby reducing the fabrication cost.

Further, the board of the metal frame facilitates to improve the heat dissipating effect of the electronic package structure.

DETAILED DESCRIPTION OF EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "on", "a" etc. are merely for illustrative purposes and should not be construed to limit the scope of the present disclosure.

Figure 2A:
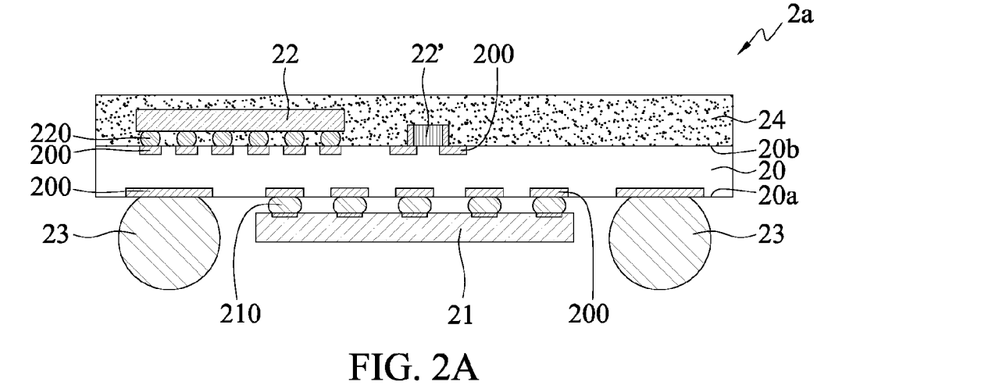
FIGS. 2A to 2C" are schematic cross-sectional views showing a method for fabricating an electronic package structure according to a first embodiment of the present disclosure, wherein FIGS. 2A' and 2C' show another embodiment of FIGS. 2A and 2C, respectively, and FIG. 2C" shows a further embodiment of FIG. 2C.
Figure 2B:
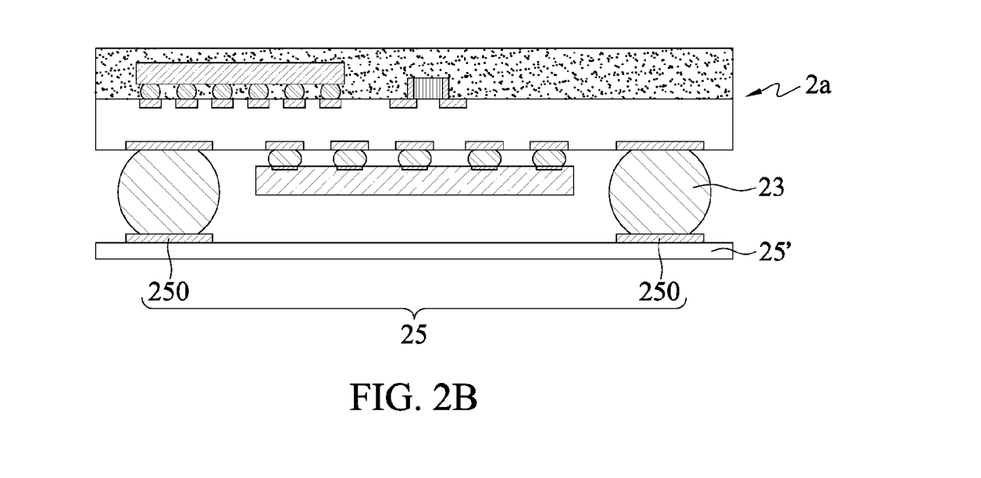
Figure 2C:
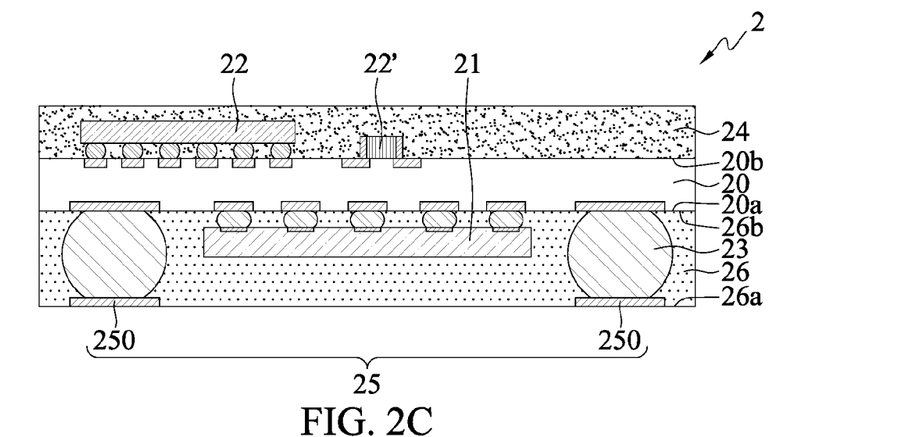

FIGS. 2A to 2C are schematic cross-sectional views showing a method for fabricating an electronic package structure 2 according to a first embodiment of the present disclosure.

Referring to FIG. 2A, an electronic unit 2a is provided. The electronic unit 2a has a carrier 20, and a first electronic component 21, a plurality of second electronic components 22, 22' and a plurality of conductive elements 23 disposed on the carrier 20.

The carrier 20 has a first side 20a and a second side 20b opposite to the first side 20a. In an embodiment, the carrier 20 is a packaging substrate having a core layer and circuit structure, or a coreless circuit structure, which has a plurality of circuit layers 200 such as fan-out redistribution layers. In another embodiment, the carrier 20 is a carrying unit for carrying electronic components such as chips. In an embodiment, the carrier 20 is a lead frame.

The first electronic component 21 is disposed on the first side 20a of the carrier 20. In an embodiment, the first electronic component 21 is an active element such as a semiconductor chip, a passive element, such as a resistor, a capacitor or an inductor, or a combination thereof. In an embodiment, the first electronic component 21 is flip-chip disposed on and electrically connected to the circuit layers 200 through a plurality of conductive bumps 210 made of, for example, a solder material. In another embodiment, the first electronic component 21 is electrically connected to the circuit layers 200 through a plurality of bonding wires (not shown).

The second electronic components 22 and 22' are disposed on the second side 20b of the carrier 20. In an embodiment, the second electronic components 22 and 22' include an active element such as a semiconductor chip, a passive element such as a resistor, a capacitor or an inductor, or a combination thereof. In an embodiment, the second electronic component 22 is an active element, and the second electronic component 22' is a passive element. In another embodiment, the second electronic component 22 is flip-chip disposed on and electrically connected to the circuit layers 200 through a plurality of conductive bumps 220 made of, for example, a solder material. In another embodiment, the second electronic component 22 is electrically connected to the circuit layers 200 through a plurality of bonding wires (not shown). In an embodiment, the second electronic component 22' is in direct contact with the circuit layers 200.

The conductive elements 23 are disposed on the circuit layers 200 on the first side 20a of the carrier 20. In an embodiment, the conductive elements 23 are solder balls.

Further, the electronic unit 2a has a first encapsulant 24 formed on the second side 20b of the carrier 20 and encapsulating the second electronic components 22 and 22'.

In an embodiment, the first encapsulant 24 is made of polyimide, a dry film, an epoxy resin, or a molding compound.

In another embodiment, referring to FIG. 2A', the first encapsulant 24 is dispensed with.

Referring to FIG. 2B, continued from the process of FIG. 2A, the electronic unit 2a is bonded to a metal frame 25 through the conductive elements 23.

In an embodiment, the metal frame 25 is a lead frame having a plurality of conductive pads 250. The conductive pads 250 are separated from one another and bonded to the conductive elements 23.

Before the electronic unit 2a is bonded to the metal frame 25, the metal frame 25 can be optionally disposed on a supporting member 25' such as a tape.

In an embodiment, the electronic unit 2a is bonded to a plurality of metal frames 25.

Referring to FIG. 2C, through a single-side molding process, a second encapsulant 26 is formed between the first side 20a of the carrier 20 and the metal frame 25 (or the supporting member 25') and encapsulates the first electronic component 21 and the conductive elements 23. Thereafter, the supporting member 25' is removed. As such, an electronic package structure 2 is obtained.

In an embodiment, the second encapsulant 26 is made of polyimide, a dry film, an epoxy resin, or a molding compound. The second encapsulant 26 has a first surface 26a and a second surface 26b opposite to the first surface 26a, and the second surface 26b of encapsulant 26 is bonded to the first side 20a of the carrier 20. The metal frame 25 is embedded in the first surface 26a of the encapsulant 26, and the conductive pads 250 are exposed from the first surface 26a of the encapsulant 26. In an embodiment, surfaces of the conductive pads 250 are flush with the first surface 26a of the encapsulant 26. As such, a solder material such as solder balls (not shown) can further be formed on the exposed surfaces of the conductive pads 250 for bonding with an electronic device such as a circuit board.

In another embodiment, referring to FIG. 2C', which is continued from the process of FIG. 2A', through a double-side molding process, a second encapsulant 26 is formed to encapsulate both the first electronic component 21 and the second electronic components 22 and 22'. As such, an electronic package structure 2' is obtained.

Figure 6A:
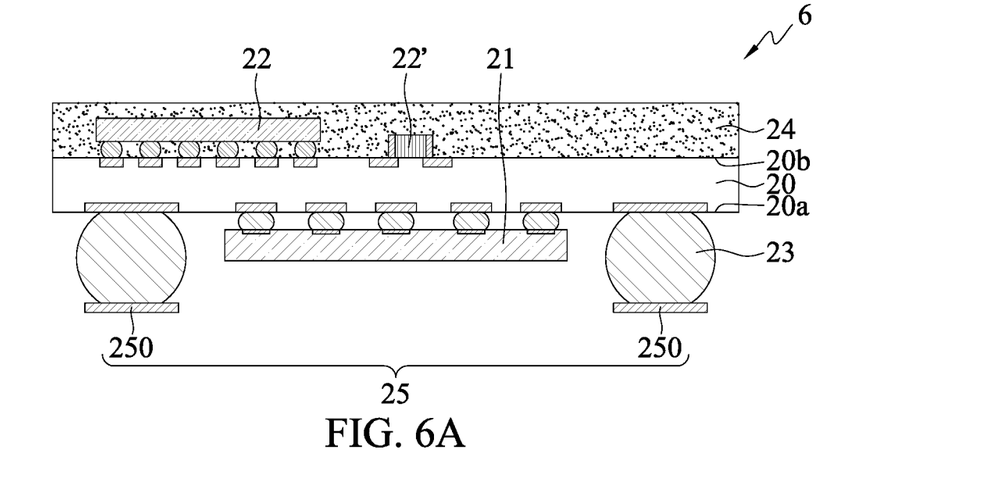
FIGS. 6A and 6B are schematic cross-sectional views showing other embodiments of FIG. 2C.
Figure 6B:
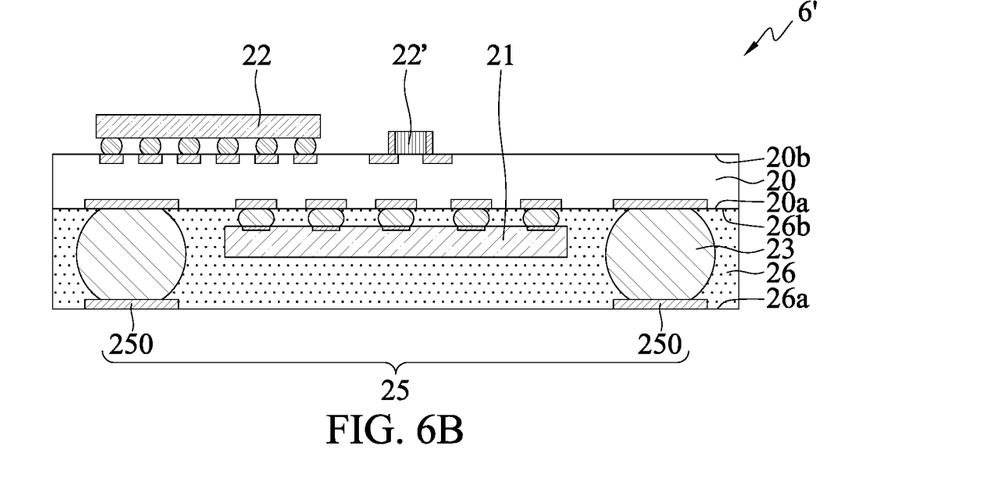

Further, either the first encapsulant 24 or the second encapsulant 26 can be dispensed with. Referring to FIG. 6A, only the first encapsulant 24 is formed and the second encapsulant 26 is dispensed with. Alternatively, referring to FIG. 6B, only the second encapsulant 26 is formed and the first encapsulant 24 is dispensed with.

The second encapsulant 26 and the first encapsulant 24 can be made of the same or different materials.

In a further embodiment, referring to FIG. 2C", the conductive elements 23' and 23" can be made of copper core balls, passive elements, such as resistors, capacitors or inductors, or (post-shaped, block-shaped or pin-shaped) metal members. In an embodiment, referring to FIG. 2C", the left conductive element 23' is a copper core ball and the right conductive element 23" is a decoupling capacitor. Further, referring to FIG. 5A, the conductive elements 53 can be made of a solder paste or a conductive adhesive, and the height of the conductive pads 550 can be adjusted (for example, increased) according to the need. In another embodiment, referring to FIG. 5B, a conductive element 53' and the corresponding conductive pad 550 can be an integrally-formed metal member and bonded to the first side 20a of the carrier 20 through an insulator 53" made of, for example, an epoxy resin. As such, the conductive element 53' and the corresponding conductive pad 550 are only used as a supporting member, and are not electrically connected to the carrier 20. It should be noted that various types of the conductive elements 23, 23', 23", 53, 53' can be provided in the same package.

In addition, referring to FIG. 2C", a plurality of conductive elements 23 can be formed on the circuit layers 200 of the second side 20b of the carrier 20 and bonded to a metal frame 25".

According to the present disclosure, the electronic unit 2a is bonded to the metal frame 25, 25" first and then the second encapsulant 26 is formed in a manner that the metal frame 25, 25" is exposed from the second encapsulant 26 to serve as an electrical contact. Therefore, instead of using a mold having a particular size corresponding to the electronic package structure 2, 2' as in the prior art, the present disclosure can use a common mold to form the second encapsulant 26, thus reducing the fabrication cost.

Figure 3:
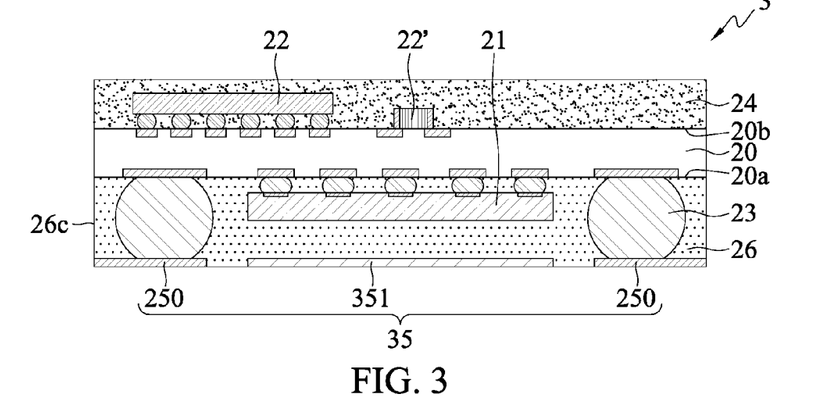
FIG. 3 is a schematic cross-sectional view of an electronic package structure according to a second embodiment of the present disclosure.

FIG. 3 is a schematic cross-sectional view of an electronic package structure 3 according to a second embodiment of the present disclosure. The second embodiment differs from the first embodiment in the configuration of the metal frame.

Referring to FIG. 3, the metal frame 35 has a plurality of conductive pads 250 bonded to the conductive elements 23, and a board 351 corresponding in position to the first electronic component 21.

The board 351 is separated from the conductive pads 250. Further, referring to FIG. 3A, the conductive pads 250 are arranged around an outer periphery of the board 351. In an embodiment, the conductive pads 250 can be arranged in one or more circles around the outer periphery of the board 351. For example, referring to FIG. 3B, the conductive pads 250 are arranged in two circles around the outer periphery of the board 351.

In an embodiment, the second encapsulant 26 is formed between the board 351 and the first electronic component 21. That is, the board 351 is in no contact with the first electronic component 21.

Further, the heights (or thicknesses) of the board 351 and the conductive pads 250 can be equal.

Figure 4A:
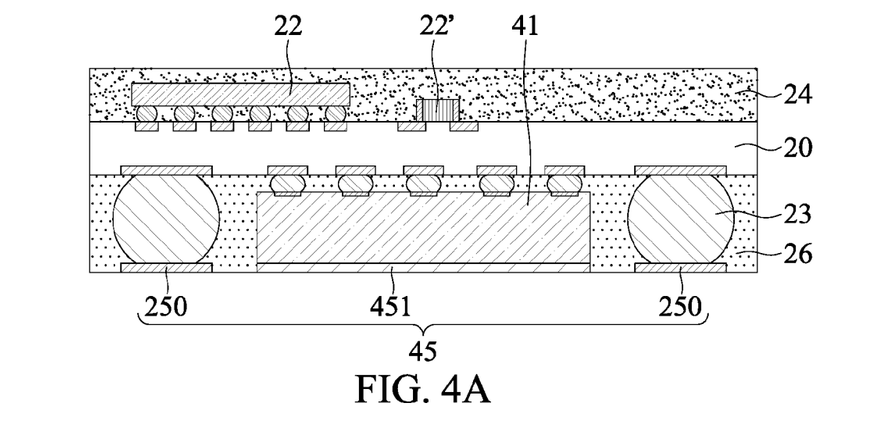
FIGS. 4A to 4C are schematic cross-sectional views showing other embodiments of FIG. 3.
Figure 4B:
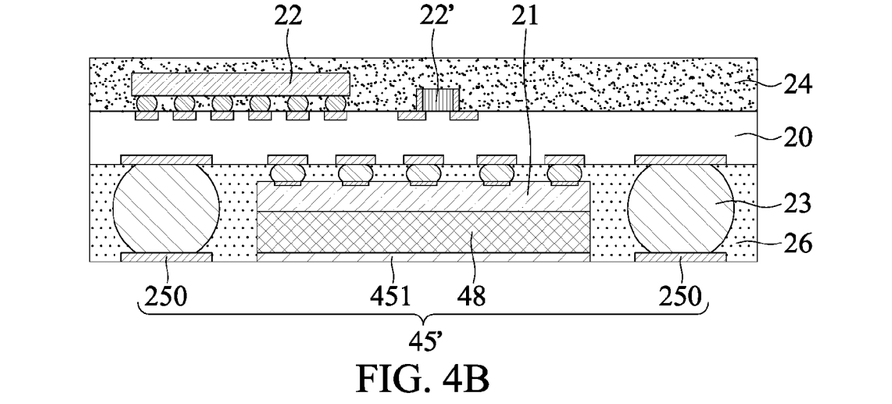

In another embodiment, referring to FIG. 4A, the board 451 of the metal frame 45 is in contact with the first electronic component 41. In a further embodiment, referring to FIG. 4B, the board 451 of the metal frame 45' is bonded to the first electronic component 21 through an intermediate layer 48. The intermediate layer 48 is made of, for example, a thin film, an epoxy resin or a thermal interface material.

Figure 4C:
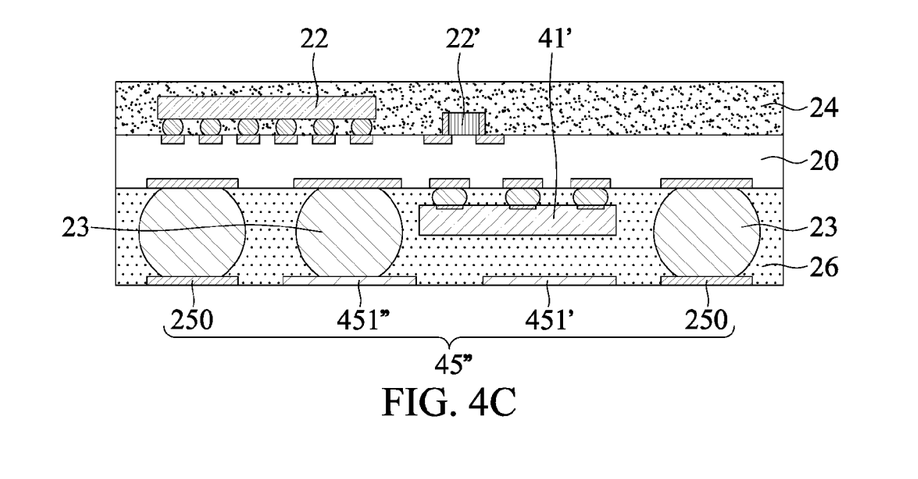

In still another embodiment, referring to FIG. 4C, the metal frame 45" has a plurality of boards 451' and 451" separated from one another, and the conductive pads 250 are arranged around an outer periphery of the boards 451' and 451". In an embodiment, the boards 451' corresponds in position to the first electronic component 41' and the board 451" serves as a conductive pad. In another embodiment, the board 451" is bonded to the first side 20a of the carrier 20 through the conductive element 23 so as to increase the number of electrical contacts. In an embodiment, the board 451" serves as a signal contact, a ground contact or a power contact.

Figure 5A:
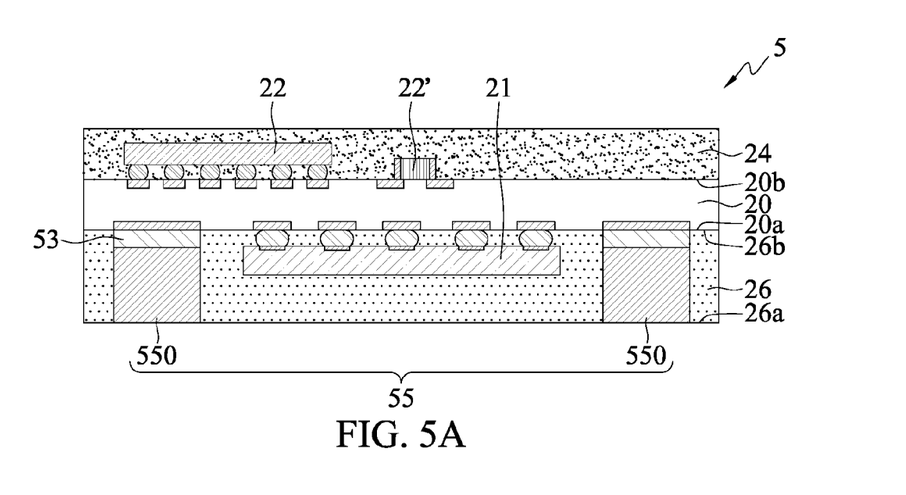
FIGS. 5A and 5B are schematic cross-sectional views showing other embodiments of conductive elements of FIG. 2C.
Figure 5B:
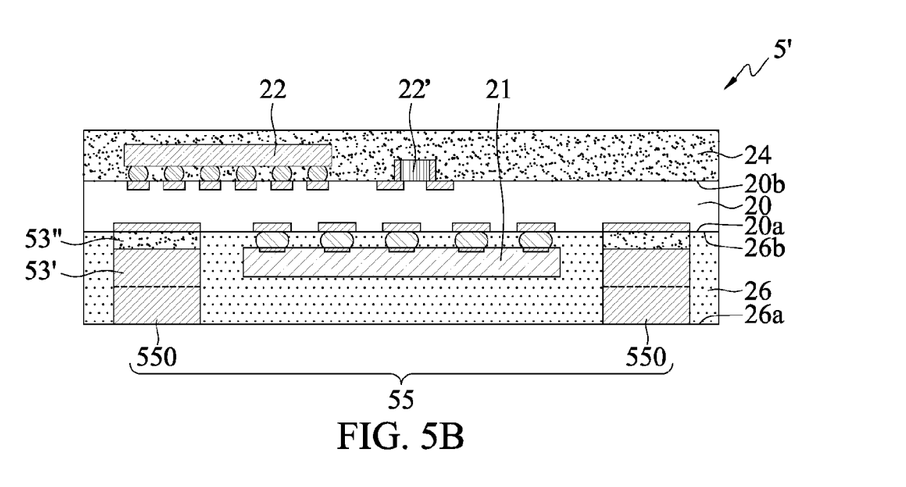
Figure 7A:
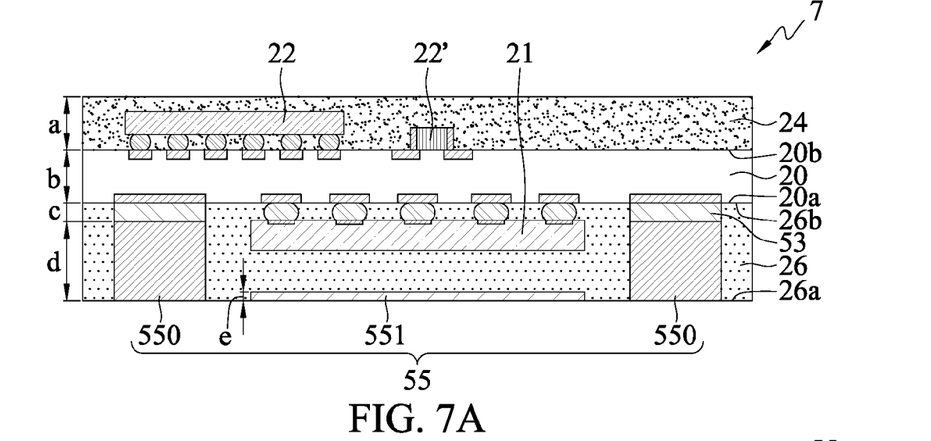
FIG. 7A is a schematic cross-sectional view showing another embodiment of FIG. 5A.
Figure 7B:
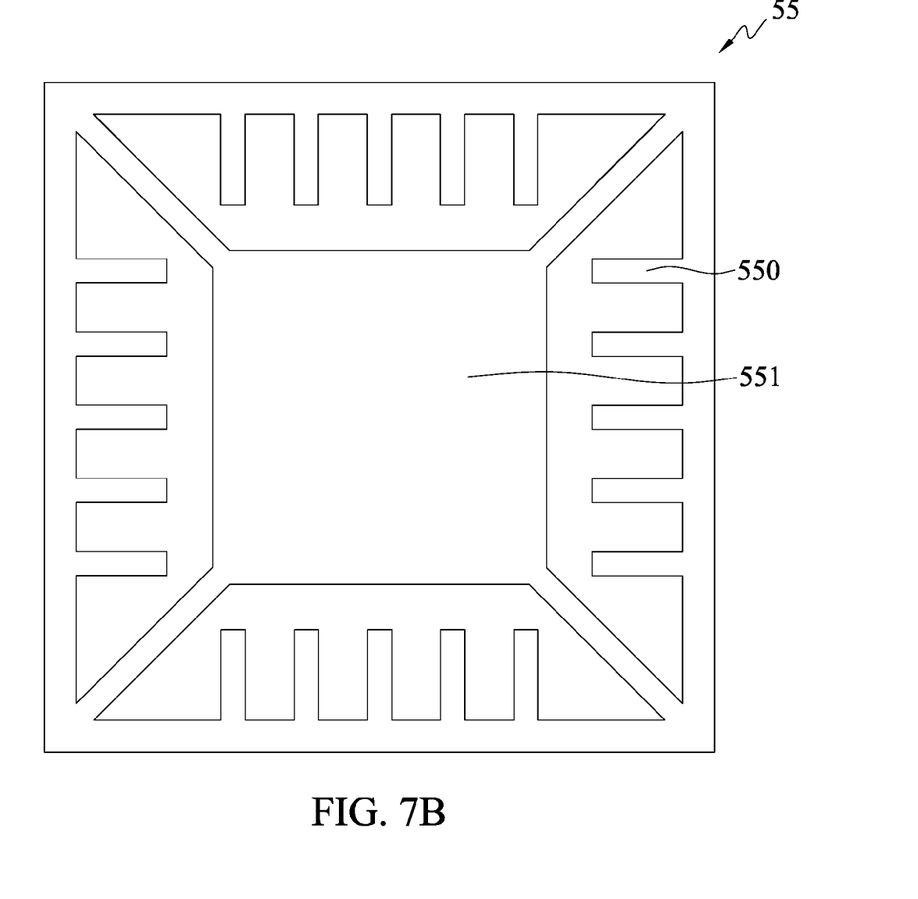
FIG. 7B is a schematic upper view of a metal frame of FIG. 7A.

Further, referring to an electronic package structure 7 of FIG. 7A, the metal frame 55 of FIG. 7A differs from that of FIG. 5A in that it has a board 551. Referring to FIG. 7B, the conductive pads 550 are arranged around an outer periphery of the board 551. To fabricate the metal frame 55, a lead frame is half-etched to have a step. That is, the height d of the conductive pads 550 is different from the height e of the board 551. As such, the lead frame 55 is bonded to the carrier 20 and provides a supporting effect and, and at the same time, a high element such as the first electronic component 21 on the first surface 20a of the carrier 20 will not come into contact with the metal frame 55. In an embodiment, the height a of the first encapsulant 24 is 430 um, the height b of the carrier 20 is 160 um, the height c of the conductive elements 53 is 50 um, the height d of the conductive pads 550 is 385 um, and the height e of the board 551 is 125 um.

Therefore, the board 351, 451, 451', 551 of the electronic package structure 3, 7 is used to conduct heat generated by the first electronic component 21, 41, 41', thus improving the heat dissipating effect of the electronic package structure 3, 7.

Figure 3A:
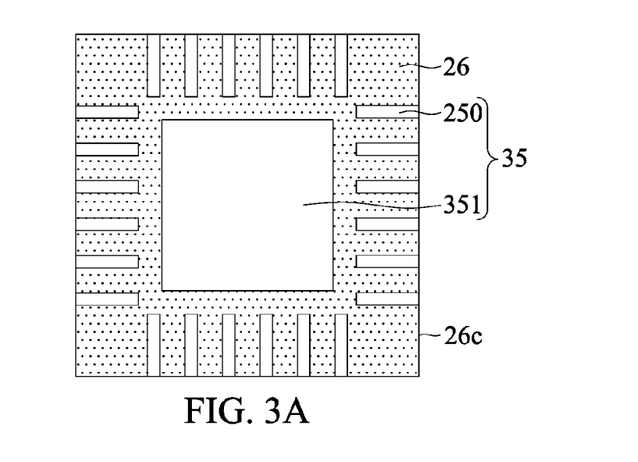
FIG. 3A is a schematic lower view of FIG. 3.
Figure 3B:
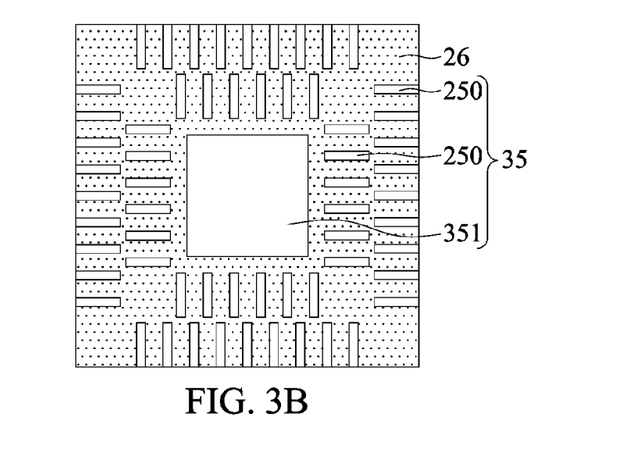
FIG. 3B shows another embodiment of FIG. 3A.

Further, referring to FIGS. 3 and 3A, the conductive pads 250 can be exposed from a side surface 26c of the second encapsulant 26. Therefore, the electronic package structure 3 is similar to a quad flat no-lead (QFN) structure.

The present disclosure further provides an electronic package structure 2, 2', 3, 5, 5', 6, 6', 7, which has: a carrier 20; a first electronic component 21, 41, 41'; a plurality of second electronic components 22, 22'; a plurality of conductive elements 23, 23', 23", 53, 53'; at least a metal frame 25, 25", 35, 45, 45', 45", 55; and first and second encapsulants 24, 26.

The carrier 20 has a first side 20a and a second side 20b opposite to the first side 20a.

The first electronic component 21, 41, 41' is disposed on the first side 20a of the carrier 20.

The second electronic components 22, 22' are disposed on the second side 20b of the carrier 20.

The conductive elements 23, 23', 23", 53, 53' are disposed on the first side 20a and/or the second side 20b of carrier 20.

The metal frame 25, 25", 35, 45, 45', 45", 55 has a plurality of conductive pads 250, 550 bonded to the conductive elements 23, 23', 23", 53, 53'.

The first and second encapsulants 24, 26 are formed on the carrier 20 and/or the metal frame 25, 25", 35, 45, 45', 45", 55 and encapsulate the second electronic components 22, 22' and/or the first electronic component 21, 41, 41' and/or the conductive elements 23, 23', 23", 53, 53'.

In an embodiment, the conductive elements 23, 23', 23", 53, 53' are conductive paste, conductive adhesive, solder balls, copper core balls, passive elements or metal members.

In an embodiment, the conductive pads 250 are exposed from a first surface 26a (and a side surface 26c) of the second encapsulant 26.

In an embodiment, the metal frame 35, 45, 45', 45", 55 further has a board 351, 451, 451', 551 corresponding in position to the first electronic component 21, 41, 41'. In an embodiment, the conductive pads 250 are separated from the board 351, 451, 451', 551.

In an embodiment, the board 351, 451', 551 is in no contact with the first electronic component 21, 41'.

In an embodiment, the board 451 is in contact with the first electronic component 41.

In an embodiment, the board 451 is bonded to the first electronic component 21 through an intermediate layer 48.

In an embodiment, the conductive elements 53' are bonded to the carrier 20 through an insulator 53".

According to the present disclosure, the conductive elements are bonded to the metal frame and the metal frame is exposed from the encapsulant to serve as an electrical contact. As such, instead of using a mold having a particular size corresponding to the electronic package structure as in the prior art, the present disclosure can use a common mold to form the encapsulant, thereby reducing the fabrication cost.

Further, the board of the metal frame facilitates to improve the heat dissipating effect of the electronic package structure.

The above-described descriptions of the detailed embodiments are only to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. An electronic package structure, comprising:
    a carrier;
    at least one electronic component disposed on the carrier;
    a plurality of conductive elements disposed on the carrier;
    a metal frame having a plurality of conductive pads bonded to the conductive elements and a board corresponding in position to the electronic component, wherein at least a part of the board is located at a projected area of the electronic component; and
    an encapsulant formed on at least one of the carrier and the metal frame and encapsulating at least one of the electronic component and the conductive elements, wherein the board is embedded in the encapsulant with an outer surface of the board exposed from a first surface of the encapsulant.

2. The electronic package structure of claim 1, wherein the carrier is a packaging substrate, a coreless circuit structure, or a lead frame.

3. The electronic package structure of claim 1, wherein the carrier has a first side and a second side opposite to the first side, and the first side and the second side of the carrier are each disposed with at least one of the at least one electronic component and the metal frame.

4. The electronic package structure of claim 1, wherein the electronic component is positioned between the carrier and the metal frame.

5. The electronic package structure of claim 1, wherein the conductive elements are at least one of solder paste, conductive adhesive, solder balls, copper core balls, passive elements and metal members.

6. The electronic package structure of claim 1, wherein the metal frame is a lead frame.

7. The electronic package structure of claim 1, wherein the conductive pads are exposed from the encapsulant.

8. The electronic package structure of claim 1, wherein the conductive pads are separated from the board.

9. The electronic package structure of claim 1, wherein the board and the conductive pads have the same height.

10. The electronic package structure of claim 1, wherein the board and the conductive pads have different heights.

11. The electronic package structure of claim 1, wherein the board is in contact with the electronic component.

12. The electronic package structure of claim 1, wherein the board is free from being in contact with the electronic component.

13. The electronic package structure of claim 1, wherein the board is bonded to the electronic component through an intermediate layer.

14. The electronic package structure of claim 1, wherein at least one of the conductive elements is bonded to the carrier through an insulator.

15. A method for fabricating an electronic package structure, comprising:
    providing an electronic unit having a carrier with at least one electronic component and a plurality of conductive elements disposed on the carrier;
    bonding the electronic unit to a metal frame through the conductive elements, wherein the metal frame has a plurality of conductive pads and the metal frame is bonded to the conductive elements through the conductive pads, and wherein the metal frame further has a board corresponding in position to the electronic component; and
    forming an encapsulant on at least one of the carrier and the metal frame to encapsulate at least one of the electronic component and the conductive elements, wherein the board is embedded in the encapsulant with an outer surface of the board exposed from a first surface of the encapsulant.

16. The method of claim 15, wherein the carrier is a packaging substrate, a coreless circuit structure, or a lead frame, and the conductive elements are at least one of solder paste, conductive adhesive, solder balls, copper core balls, passive elements and metal members.

17. The method of claim 15, wherein the carrier has a first side and a second side opposite to the first side, and the first side and the second side of the carrier are each disposed with at least one of the at least one electronic component and the metal frame.

18. The method of claim 15, wherein the electronic component is positioned between the carrier and the metal frame.

19. The method of claim 15, wherein the metal frame is a lead frame.

20. The method of claim 15, wherein the conductive pads are exposed from the encapsulant.

21. The method of claim 15, wherein the conductive pads are separated from the board.

22. The method of claim 15, wherein the board is bonded to the electronic component through an intermediate layer.

23. The method of claim 15, wherein at least one of the conductive elements is bonded to the carrier through an insulator.

* * * * *